(12) United States Patent
Wu

(10) Patent No.: US 6,225,238 B1
(45) Date of Patent: May 1, 2001

(54) LOW DIELECTRIC CONSTANT POLYORGANOSILICON COATINGS GENERATED FROM POLYCARBOSILANES

(76) Inventor: Hui-Jung Wu, 38770 Buckboard Common, Fremont, CA (US) 94536

( * ) Notice: Subject to any disclaimer, the term of this patent is extended or adjusted under 35 U.S.C. 154(b) by 0 days.

(21) Appl. No.: 09/327,356

(22) Filed: Jun. 7, 1999

(51) Int. Cl.[7] .......................... H01L 21/31; H01L 21/469
(52) U.S. Cl. .......................... 438/778; 438/780; 438/781; 438/788; 438/790; 427/96; 427/126.2; 427/377; 427/387
(58) Field of Search .................................. 438/623, 781, 438/778, 780; 427/96, 126, 377, 387, 228

(56) References Cited

U.S. PATENT DOCUMENTS 5,602,060 * 2/1997 Kobayashi et al. .................. 438/781
5,789,325 * 8/1998 Chandra et al. .................. 438/781

* cited by examiner

*Primary Examiner*—Charles Bowers
*Assistant Examiner*—Asok Kumar Sarkar

(57) ABSTRACT

Polyorganosilicon dielectric coatings are prepared by subjecting specified polycarbosilanes to thermal or high energy treatments to generate cross-linked polyorganosilicon coatings having low k dielectric properties. The thermal process includes multi-step sequentially increasing temperature heating steps. The instantly prepared polyorganosilicon polymers can be employed as dielectric interconnect materials and film coatings for conductor wiring in semiconductor devices. These polyorganosilicon film coatings have the additional characteristics of relative thermal stability and excellent adhesion to substrate surfaces.

8 Claims, 5 Drawing Sheets

LOW DIELECTRIC CONSTANT POLYORGANOSILICON COATINGS GENERATED FROM POLYCARBOSILANES

BACKGROUND OF THE INVENTION

1. Field of the Invention

The present invention relates generally to polycarbosilane generated compositions and methods of manufacture thereof, and more specifically to polyorganosilicon compositions that form low dielectric constant, low moisture absorbing and high glass transition temperature dielectric films or coatings for micro-electronic devices, and methods of manufacture thereof. Additionally, the present invention relates to a method of forming a polycarbosilane derivative as an electrically insulating layer, i.e., a dielectric layer, between metal or other electrically conducting paths or layers in semiconductor devices. The polycarbosilane dielectric layer is referred hereinafter to as an interlayer or interline dielectric layer. Also, the dielectric layer can act as a protective layer for protecting the device from the environment, if it is applied to the top surface of the semiconductor device.

The term "semiconductor device" used herein is intended to mean a variety of devices having a substrate consisting of semiconductor material, such as silicon, having patterned thereon semiconductor integrated circuits (ICs), large scale integration circuits (LSIs), very large scale integration circuits (VLSIs) ultra large scale integration circuits (ULSIs) and the like as well as any other electronic devices employing semiconductor material.

2. Background of the Related Art

In the prior art production of semiconductor integrated circuit devices, fine patterns of semiconductor regions, electrodes, wiring and other components are fabricated onto the semiconductor substrate by using conventional process steps, one being chemical vapor deposition (CVD). After formation of the wire pattern on the device, an interline dielectric material deposition is formed between the horizontally disposed wiring, the pattern overlaid with dielectric film forming material, and multi-layer formation processes, well-known in the art, are provided to form a multi-layered integrated semiconductor device.

Presently, advances in the semiconductor industry are characterized by the introduction of new generations of integrated circuits (ICs) having higher performance and greater functionality than that of previous generations for the purpose of obtaining rapid processing of voluminous information. These advances are often the result of reducing the size of the IC devices; that is, the advances in the integration do not rely upon the expansion of the size or dimension of the device, i.e., the chip, but can be obtained by miniaturizing and increasing the number of components fabricated in the chip and accordingly reducing the dimensions of the chips themselves. As a result, the minimum size of line and space of the wiring in the chips is on the order of submicrons and as a necessity, the wiring structure adopted in current chips is a multi-layer or multi-level wiring or metallization structure.

However, as device geometries in semiconductor wafers approach and then go beyond dimensions as small as 0.25 microns ($\mu$m), the dielectric constant of insulating material used between conductive paths, for example silicon oxide ($SiO_2$), becomes an increasingly significant factor in device performance. As the distance between adjacent conductive paths become smaller, the resulting capacitance, a function of the dielectric property of the insulating material divided by the distance between conductive paths, increases. This causes increased capacitive coupling, or cross-talk, between adjacent conductive paths which carry signals across the chip. The increased capacitance further results in increased power consumption for the IC and an increased RC time constant, the latter resulting in reduced signal propagation speed. In sum, the effects of miniaturization cause increased power consumption, limit achievable signal speed, and degrade noise margins used to insure proper IC device or chip operation.

One way to diminish power consumption and cross talk effects is to decrease the dielectric constant of the insulator, or dielectric, which separates the conductors. Probably the most common semiconductor dielectric is silicon dioxide, which has a dielectric constant (k) of about 3.9. In contrast, air (including partial vacuum) has a dielectric constant of just over 1. Still other insulating materials can provide films having low dielectric constants in the range of approximately 2.0 to 3.0, significantly lower than that of the silicon dioxide films. Therefore, it is well-known that reduced capacitance in the use of certain organic or inorganic insulating materials can result in the alleviation of the aforementioned problems of capacitive coupling and the like. However, any material contemplated for use in semiconductor devices must meet other criteria in addition to a low dielectric constant before it can be used to replace the commonly employed silicon dioxide. For example, any coating material contemplated for use as a dielectric in a semiconductor device should demonstrate the following qualities or characteristics:

1. Excellent Electrical Insulating Properties;
2. High Thermal Stability;
3. Crack Resistance; and
4. Good Adhesion to Underlying Coated Substrates.

Many dielectric materials have been proposed for use as dielectric film coatings in semi-conductor devices, but most of them are considered to be unsatisfactory in meeting the above-mentioned stringent electrical and physical requirements. The dielectric film forming materials include inorganic materials which are applied over a patterned wiring layered structure by chemical vapor deposition (CVD) processes. Typical examples of useful inorganic dielectric materials include the already cited silicon dioxide ($SiO_2$), silicon nitride ($Si_3N_4$) and phosphosilicate glass (PSG). The preferred formation of these inorganic dielectrics by chemical vapor deposition processes leaves these inorganic dielectric layers inherently uneven because plasma based deposition processes exactly reproduce the uneven and stepped profile structure of the underlying wiring pattern. On the other hand, useful organic/inorganic dielectric materials such as polyimide resins, organic SOG (Spin-On-Glass), and other organic/inorganic dielectric materials have generally been unsatisfactory in one or more of the desired electrical or physical properties of an interlayer dielectric coating outlined above. For example, polyimide resins demonstrate high moisture absorption due to their polarizing chemical structures, which moisture causes an undesirable increase in the dielectric constant of the particular polyimide material being used.

In response to the need for low dielectric coating materials which can be used as a replacement for silicon dioxide, it has been found that certain polycarbosilanes can be subjected to controlled thermal processing to avoid cerami-fication (oxidation to $SiO_2$) and form organo-silicon polymers having excellent dielectric properties (low k or low capacitance dielectrics), readily useful as film forming materials in the manufacturer of semiconductor devices. The polyorganosilicon dielectric insulating film materials of the present invention are characterized by a dielectric constant of as low as 2.5, well below that of silicon dioxide, and a capability of formation of globally planarized, thermally stable, and adherent dielectric layers on semiconductor devices, all heretofore unappreciated in the prior art. For example, in U.S. Pat. No. 5,602,060 to Kobayashi there is disclosed a process for preparing semiconductor wafers by applying an organic solvent solution of a particular polycarbosilane onto a wire patterned semiconductor wafer and curing the resulting film layer of the polycarbosilane at temperatures equal to or greater than 350° C. in an oxidizing atmosphere to convert (ceramify) the entire film into a silicon oxide layer. While this patented process has certain advantages in achieving a totally planarized film surface from an organic polycarbosilane precursor, the ultimate silicon dioxide insulating material has an inadequate dielectric constant to meet the new geometries and wiring architecture described above.

In U.S. Pat. No. 5,789,325, to Chandra et al., a polycarbosilane material is dissolved in an organic solvent, spin coated onto an electronically patterned device, and the resulting coating heated in an oxidizing environment for a time sufficient (up to six hours) at high temperatures to ceramify and thereby form a silicon dioxide containing hardened coating on the electronic device. The very purpose of the Chandra et al is the heating of the polycarbosilane coating in an oxidizing environment to attain complete conversion (ceramification) to a to a silica containing coating. The Chandra et al. process is, like that of Kobayashi, inadequate in achieving k values below 3 because the nature of the ultimately formed silicon base coating would inherently have a dielectric constant approximating that of silicon dioxide (3.9).

It has been discovered that certain polycarbosilanes can be subjected to energy generating controlled processes under controlled conditions to generate certain organo silicon films having low dielectric constants and sufficient glass transition temperature values (Tg) above 350° C. so as to form heat resistant semiconductor film coatings, which can withstand the hostile environments of semiconductor plasma processing. The polyorganosilicon coating generating processes can employ any energy source such as thermal (heat) or high energy source such as thermal (heat), electron-beam (e-beam), U.V. light, and any other functional high energy source. These energy sources are applied to the polycarbosilanes of the present invention in a controlled manner to convert the polycarbosilanes to polyorganosilicon materials, which unexpectedly form low k dielectric coatings or films. A preferred high energy processing is the application of thermal (heat) energy to the instant polycarbosilanes in discreet incremental steps of increasing temperature to form the instant low k polyorganosilicon coatings.

These low k polyorganosilicon dielectric coatings of the present invention have good adhesion to a variety of common semiconductor surfaces without the use of adhesive agents. Moreover, the instant polyorganosilicon dielectric coatings possess significant gap filling characteristics, thereby providing complete fill between conductive spaces of 0.25 microns ($\mu$m) or less. These low k polyorganosilicon dielectrics also possess sufficient thermal stability so as not to evidence any outgassing during ongoing semiconductor processing, low moisture absorption to retain film resistivity, and stability to a variety of common etching processes. As in the case of applying an organic photoresist film coating to a semiconductor wafer, the present low k polycarbosilane generated dielectric coatings can be easily applied in high yield to electronic substrates using standard spin-bake-cure processing techniques, thereby insuring the cost effectiveness of the polycarbosilane precursor materials. Finally, the polycarbosilane generated dielectric coatings developed and disclosed herein are applicable for use in other micro electronic devices in addition to ICs, for example, printed circuit boards (PCBs), multi-chip modules (MCMs) and the like.

SUMMARY OF THE INVENTION

The present invention provides methods for forming thermally stable, adhesive, low dielectric constant k less than 4.0, preferably less than 3.0, and most preferably less than 2.5) polyorganosilicon dielectric films for use as semiconductor insulators. Surprisingly, the methods of the present invention can provide polyorganosilicon coatings having very low dielectric constants which coatings are generated from specified polycarbosilane starting materials employing wet coating and standard high energy generating processes, without the need for exotic production techniques or incurring disadvantages found in other low k dielectric film forming methods.

In accordance with the present invention, there is provided a process for the preparation of a low dielectric constant polyorganosilicon coating by applying to a substrate a composition comprising a specified polycarbosilane of the general formula:

FORMULA (I)

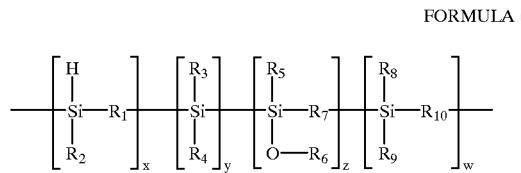

in which:
  $R_1$, $R_7$, and $R_{10}$ each independently represents a substituted or unsubstituted alkylene, cycloalkylene, or arylene group;
  $R_2$, $R_3$, $R_4$, $R_5$, $R_8$ and $R_9$ each independently represents a hydrogen atom or organic group.
  R6 represents an organosilicon, a silanyl, a siloxyl, or an organo group; and
  x, y, z and w satisfying the conditions of [10<x+y+z+w <100,000], and y and z and w can collectively or independently be zero.

The polycarbosilane coated substrate is then subjected to a thermal or high energy source under controlled conditions to cause interaction and crosslinking of the polycarbosilane to form a polyorganosilicon coating having a dielectric constant of less than 4. In a preferred process embodiment, the polycarbosilane (Formula (I)) coated substrate is subjected to thermal energy by heating it in multistage process steps at sequentially elevated temperatures of from 50° C. to about 450° C. under controlled conditions and environments to convert the polycarbosilane to a thermally stable polyorganosilicon coating having a low dielectric constant of less than 4.

The preferred process herein is directed to balking the polycarbosilane of Formula I in multistage steps at sequentially elevated temperature plateaus of from about 50° C. to about 450° C. in a controlled manner and environment; and further heating and curing the pretreated polycarbosilane at temperatures exceeding 400° C. to form an organosilicon polymer film having electrically insulating properties characterized by a dielectric constant of less than 4.0. More precisely, in the heating or baking process of the present invention, the polycarbosilane of Formula I is subjected to multiple heating (baking) steps at sequentially increasing temperatures of not more than 100° C. and 200° C., respectively, under atmospheric or non-oxidizing (e.g.; inert or non-reacting gases such as nitrogen or argon gas) environmental conditions for periods sufficient to inter-react and cross link the polycarbosilane; further baking the polycarbosilane at temperatures of from 200° C. to 400° C. to effect further crosslinking; and thereafter heat curing the cross-linked polycarbosilane under non-oxidizing environments (e.g. inert or non reacting gas environments such as Nitrogen, Argon etc.) at temperatures of up to 450° C. to achieved densification of the final organo silicon coating to form a film characterized by a low dielectric constant.

By selecting the specified polycarbosilanes of Formula I and subjecting them to the particular thermal (heating) process conditions herein, a cross-linked organosilicon polymer is achieved which possesses low dielectric constants of less than 4.0. The selection of the particular polycarbosilanes of Formula I and the subjection of these materials to the multistep heating process of the instant invention enable a controlled crosslinking (and optionally oxidation) of the polycarbosilane starting (precursor) materials to form the present polycarbosilane generated organo-silicon polymers while avoiding the complete ceramification or oxidation of these polyorganosilicon materials, which ceramification generally takes place in prior art polycarbosilane heating processes. The instant process generates a low dielectric constant polyorganosilicon coating that is thermally stable under hostile high temperature environments encountered in semiconductor processing and further demonstrates good adhesion to substrates upon which the material is coated.

The present processes are based on the findings that prior art polycarbosilane coating materials are not generally suitable for accomplishing low k dielectric constant values needed for coating the presently miniaturized patterned wiring of semiconductor wafers. It has been found that the prior art uncontrolled heating processes used to bake and cure such topographical coatings cause cross-linking and chemical reaction that disturbs the organo-silicon nature of the particular polycarbosilane, with the result that the organo-silicon polymer is cleaved and oxidized to a point of forming a preponderance of oxygenated silicon throughout the material, thereby eliminating the beneficial features of an organo silicon coating. Put another way, the ceramified organo-silicon films generated in the prior art processes have resistivities approximating silicon dioxide and are inflexibly solid, resulting in brittleness and other properties unsuitable in a low dielectric constant film coatings needed in present semiconductor patterning. By contrast, it has been found that the instant polycarbosilanes provided herein react in a specified way when subjected to the multi-heating steps of the instant process and result in film forming polymeric material which has the requisite electrical properties for semiconductor insulation use and the physical properties of thermal stability under severe processing conditions and high adhesivity to substrate surfaces used in the electronics industry.

More precisely, the polycarbosilane precursor compositions represented by Formula (1) react under the high energy source conditions of the present invention to generate low dielectric constant polyorganosilicon films (k less than 4) suitable for use as dielectric interlayers or interliners in semiconductor integrated circuits. Crucial to the materials discovered herein are the findings that the polycarbosilanes of Formula I have (1) a reactive hydrido substituted silicon and (2) stable alkylene, cycloalkylene, or arylene substituents ($R_1$, $R_7$, and $R_{10}$) in the backbone structure of the polycarbosilane. These two features offer an polycarbosilane polymer that is both reactive and durable when subjected to the multiple-stage heating process of the present invention. In the preferred thermal embodiment of the invention, solution coatings of the instant polycarbosilane materials are subjected to a multistage heating process at sequentially increasing temperature plateaus of from 50° C. to 450° C. in multistage steps of less than 100° C., 200° C. and 400° C., respectively, under atmospheric conditions for periods sufficient to oxidize and cross-link the polycarbosilane; and, thereafter, the polycarbosilane generated polyorganosilicon derivative is finally heated in a curing step at temperatures of from 400° C. up to 450° C. under a non-oxidizing environment to complete the conversion of the coating to electrically useful insulating coatings having dielectric constants of less than 4. In an alternative thermal embodiment, the total multistage heating process is carried out under an inert environment to produce a non-oxidized crosslinked low k polycarbosilane derivative.

The invention specifically presented herein is a process for the preparation of a low dielectric constant polyorganosilicon material comprising: a) providing a polycarbosilane of general Formula (I); and (b) subjecting the polycarbosilane to high energy under controlled conditions to convert the polycarbosilane to a polyorganosilicon material having a dielectric constant (k) of less than 4. In one embodiment, a thermal step is employed by heating the polycarbosilane at multistage heating temperature plateaus ranging from about 50° C. to 450° C. to convert the polycarbosilane to an adhesive, heat resistant, polyorganosilicon material having a dielectric constant of less than 4. In one practice of this process, the polycarbosilane is subjected to isothermal plateau, temperatures of from 100° C. to 200° C. in one heating step, and from 200° C. to 350° C. and above 400° C. in sequential heating steps.

In still another embodiment provided herein is a process for the manufacturer of a semiconductor device comprising the steps of (a) applying a solution of the polycarbosilane provided herein as Formula (I) onto a semiconductor substrate having electrically conductive components fabricated therein; (b) heating the coated substrate at gradually increasing temperature plateaus of from 50° C. to 400° C. under certain environmental conditions for sufficient periods to convert the polycarbosilane to a crosslinked organosilicon polymer which tenaciously adheres to the substrate surface; and (c) curing the processed film coated substrate at temperatures of up to 450° C. to generate a polyorganosilicon electrically insulating film coating having a dielectric constant of less than four.

BRIEF DESCRIPTION OF THE DRAWINGS

The present invention will be more clearly understood from the description as set forth below with reference to the accompanying drawings wherein.

DETAILED DESCRIPTION OF THE PREFERRED EMBODIMENTS

Figure 1:
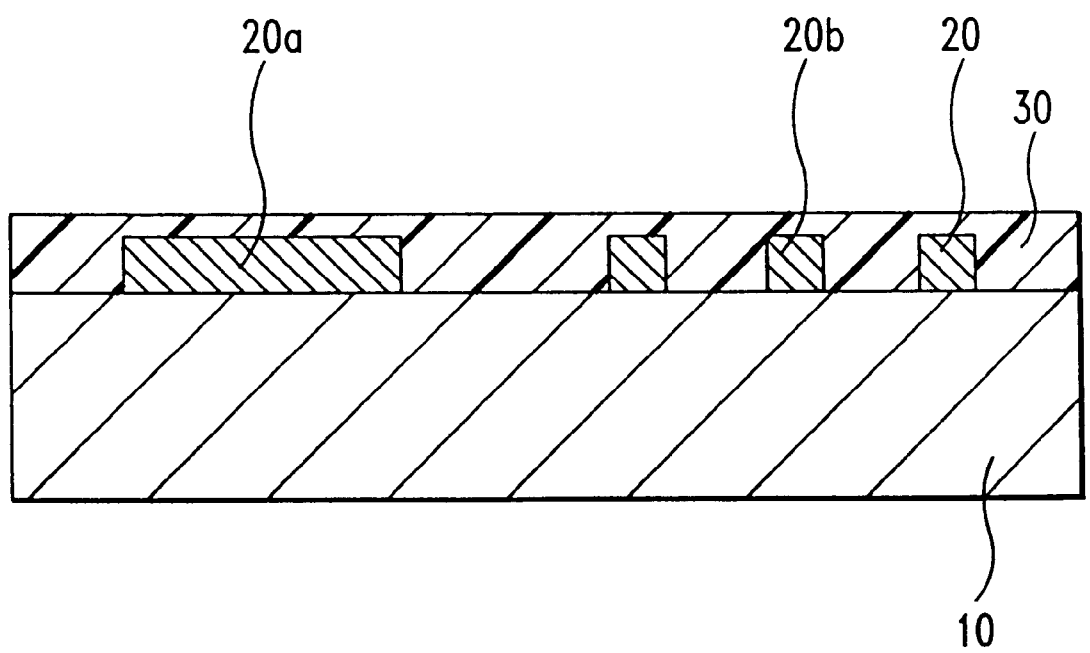
FIG. 1 is a cross-sectional view of a semiconductor device according to the present invention having a planarized dielectric film layer coating for a metallized structure.

"Silanes" as my be used herein are compounds which contain one or more silicon-silicon bonds. The term "silanyl" refers to the silane radical as it may occur in the polycarbosilanes or the polycarbosilane generated derivatives (polyorganosilicon compounds) of the present invention. The term "polysilane" is intended to include oligomeric and polymeric silanes; i.e., compounds which include two or more monomeric silane units.

"Siloxanes" as may be used herein are compounds which contain one or more silicon-oxygen bonds and may or may not contain cyclic units. The term "siloxyl" refers to a siloxane radical as it may occur in the polycarbosilanes or the polycarbosilane generated derivatives (polyorganosilicon compounds) of the present invention. The terms "polysiloxane" and "siloxane polymer" as may be used herein are intended to include oligomeric and polymeric siloxanes, i.e., compounds which include two or more monomeric siloxane units.

The term "organic" or "organo" refers to a branched, unbranched, or cyclic hrdrocarbon group or radical or 1 to 26 carbon atoms, typically or 1 to 8 carbon atoms. "Organic" or "Organo" groups include, among others, alkyl, alkenyl, alkylene, and aryl groups.

The process according to the present invention is carried out by first providing the polycarbosilane of the above described Formula (I) and then subjecting the polycarbosilane to a multistage heating process to convert the polycarbosilane to a polyorganosilicon material having a low dielectric constant The multistage heating processes herein are sequential heating steps at substantially isothermal plateaus under controlled environmental conditions to achieve conversion of the polycarbosilane to a polyorganosilicon material having the beneficial electrically insulating characteristic of a dielectric constant (k) of less than 4. The multistage heating steps are carried out at sequentially increasing temperatures of from 50° C. to 450° C. to convert the polycarbosilane of Formula (I) into a low k polyorganosilicon material. The sequential multistage heating steps herein operate at substantially isothermal temperature step plateaus of less than 100° C., 200° C., 400° C. and 450° C. The instant process can be carried out under a totally open (or oxidizing) atmospheric environment in which case the polycarbosilane is oxidized in the crosslinking conversion to the low k polyorganosilicon composition. Alternatively, the instant multistage process can be entirely carried out in an inert (or non-reactive) environment such as under a Nitrogen or Argon gas blanket to prevent oxidation of the instantly prepared polycarbosilane generated organosilicon polymer, if so desired. The final heating step of the present process is a curing step at temperatures above 400° C. and is generally conducted in a non-oxidizing environment to harden the particular polycarbosilane generated low k polyorganosilicon coating. It is to be understood that the present multistage process or any part hereof can be carried out under any environment such as inert gas, air atmosphere, unreactive gas, oxygenating gas, or mixtures thereof without departing from the spirit or scope of the invention.

In the general Formula (1) of the particular polycarbosilanes used in the present process, the substituents $R_1$ $R_7$, and $R_{10}$ groups of the Formula (I) polycarbosilanes independently represent a substituted or unsubstituted alkylene, cycloalkylene or an arylene group. The arylene group may be any divalent aromatic hydrocarbon such as phenylenes and naphthenes. The $R_1$ alkylene, cycloalkylene, or arylene groups insure the thermal stability of the polycarbosilane starting materials during the intense energy applications of the invention, particularly the multistage heating process.

$R_2$, $R_3$, $R_4$, $R_5$, $R_6$, $R_8$, and $R_9$ each independently represents a hydrogen atom or an organic group in the form of a substituted or unsubstituted alkyl, alkenyl, alkynyl, or aryl group. The alkyl, alkenyl, and alkynyl groups generally contain from about 1 to 8 carbon atoms. Preferred polycarbosilanes of the present invention include dihydrido polycarbosilanes in which the $R_2$ group is a hydrogen atom and appendant radicals are non-existent; that is y, z and w are all zero. Another preferred group of polycarbosilanes are those in which the $R_2$, $R_3$, $R_4$, $R_5$, $R_8$, and $R_9$ groups of Formula (I) are substituted or unsubstituted alkenyl groups having from 2 to 8 carbon atoms. The alkenyl group may be ethenyl, propenyl, allyl, butenyl or any other unsaturated organic backbone radical having up to 10 carbon atoms. The alkenyl group may be dienyl in nature and includes unsaturated alkenyl radicals appended or substituted on an otherwise alkyl or unsaturated organic polymer backbone. Examples of these preferred polycarbosilanes include dihydrido or alkenyl substituted polycarbosilanes include dihydridopolycarbosilane and allylhydride-polycarbosilane.

As can be observed in Formula I, the polycarbosilanes utilized in the present process may contain oxidized radicals in the form of siloxyl groups when z>0. Accordingly, $R_6$ represents an organosilicon, a silanyl, a siloxyl, or an organo group when z>0. It is to be appreciated that the oxidized versions of the polycarbosilanes of Formula I (z>0) operate very effectively in, and are well within the purview of, the multistep heating process of the present invention. As is equally apparent, z can be zero independently of x and y, the only conditions being that the radicals x, y, and z of the Formula I polycarbosilanes must satisfy the conditions of [10<x+y+z+w <100,000], and y and z can collectively or independently be zero.

The polycarbosilane compounds used herein can be produced from starting materials which are presently commercially available from many manufacturers. They may be produced by using conventional polymerizable processes. For example, the starting materials can be produced from common organo silane compounds or from polysilane as a starting material by heating an admixture of polysilane with polyborosiloxane in an inert atmosphere to thereby produce the corresponding polymer or by heating an admixture of polysilane with a low molecular weight carbosilane in an inert atmosphere to thereby produce the corresponding polymer or by heating an admixture of polysilane with a low molecular carbosilane in an inert atmosphere and in the presence of a catalyst such as polyborodiphenylsiloxane to thereby produce the corresponding polymer. Polycarbosilanes can also be synthesized by Grignard Reaction reported in U.S. Pat. No. 5,153,295 hereby incorporated by reference. Note that polycarbosilanes are well known as being useful as raw materials in the production of silicone carbide fibers as well as film coatings for electrical devices.

The instant polycarbosilane of the above-mentioned formula I is applied from a suitable solvent onto a substrate to form a film layer to be subjected to the process herein. In a preferred embodiment, a solvent solution of the polycarbosilane of formula I is applied onto a substrate having electrically conductive components fabricated therein. A wide variety of organic solvents can be used herein insofar as they are able to dissolve the polycarbosilane and at the same time effectively control the viscosity of the resulting polymeric solution as a coating solution. Various facilitating measures such as stirring and/or heating may be used to aid in the dissolution. Suitable solvents include organic solvents such as methylisobutylketone (MIBK), dibutyl ether, xylene, benzene, toluene, n-heptane, hexane, cyclohexane, octane, decane, or cyclic dimethylpolysiloxanes and the like.

Application of the instant polycarbosilanes onto planar or topographical surfaces or substrates can be carried out by using any conventional apparatus such as a spin coater, roller coater, and the like. Preferably a spin coater is used, because the polycarbosilane used herein has a controlled viscosity suitable for such a coater. Evaporation of the solvent by any suitable means such as simple air drying by exposure to an ambient environment during spin coating or by the application of a vacuum or mild heat (e.g., <50° C.) yields the desired precursor polycarbosilane coating.

The topographical substrate containing fabricated electric components, to which the solution of the polycarbosilane is applied, includes a wide variety of metal or electrically conducting layers found in conventional semiconductor devices. Typical examples of such a layer include a circuit or wiring layer, an electrode layer, and the like, and the materials of these layers include Al, Cu, Ti, TiN, Ta, TaN, W, TiW, CVD-$SiO_2$, SiON, PSG and the like.

The thickness of the polycarbosilane coating can be widely varied depending upon many factors of coating application such as particulars of the polycarbosilane used, other particulars including the concentration of the polycarbosilane solution, the wet coating process (e.g. spin coating), and configurations of the underlying layer, heating or baking temperatures, and the like. Generally, the thickness of the polycarbosilane is preferred to be in the range of about 0.05 to 3 microns ($\mu$m) more preferably, about 0.1 to 2 microns ($\mu$m).

After formation of the polycarbosilane-solvent coating, it is subjected to the thermal process of the present invention wherein the coating is subjected to multi-stage heating process at sequentially increasing temperatures ranging from 50° C. up to 450° C. to polymerize the coating to its hardened form without ceramifying the coating and destroying the polycarbosilane structure of the film. The multi-stage balling or heating process comprises (1) heating the coated polycarbosilane at a first isothermic plateau temperature not to exceed 100° C. in an atmospheric or nitrogen blanket environment for a time sufficient to remove the solvent and cross-link the polycarbosilane polymer; (2) heating the polymer at a second higher isothermic plateau temperature in an atmospheric or nitrogen blanket environment of up to 200° C. for a sufficient period to further cross link the polycarbosilane coating, (3) heating the polymer to a third higher isothermic temperature plateau of up to 400° C. under an atmospheric or nitrogen blanket environment for a period sufficient to harden the polycarbosilane coating without causing complete oxidation or ceramification of the organo silicon polymer; and finally (4) curing the polycarbosilane coating by heating it in a non-oxidizing (inert or non-reactive gaseous) enviromnent at temperatures in excess of 400° C. for a sufficient period to yield a hardened partially oxidized or non oxidized cross-linked polycarbosilane polymer having an electrical dielectric constant of less than four.

Since the baking and curing takes place in an alternative atmospheric or nitrogen environment, a non oxidized, an oxidized, or a partially oxidized cross-linked polycarbosilane results depending on the environmental conditions (oxygen atmosphere or inert gas) in which the baking or curing steps occur. The controlled multi-step baking conditions enable the polycarbosilane coating to inter-react and cross link to a polyorganosilane derivative but remain unceramified (oxidation to silicon dioxide) and retentive of the organosilicon character of the polymerized polycarbosilane. The resulting dielectric layer has a dielectric constant k or less than 4, preferably less than 3, and most preferably less than 2.5. The polyorganosilane physically demonstrates little generation of internal stress, thereby not subject to cracking, and good adhesion to flat or topographical conductive wire patterned surfaces or substrates.

Preferred increasing temperature plateaus in the instant multistep heating or baking process comprises a fir step of from about 70° C. to 90° C.; a second step of from 120° C. to 160° C. and a third step of from about 220° C. to 300° C. As will become apparent in the examples, the critical step of the present heating (or baking) and curing process of the present invention is that heating step above 200° C. and less than 400° C. It has been found that heating the polycarbosilane of formula (I) at elevated isothermic temperatures plateaus of up to 200° C. and then finally heating the processed polycarbosilane (before curing) at an isothermic temperature plateau of from 240° C. to 260° C. generates a polycarbosilane having a low dielectric constant of less than 3.

While not to be construed as limiting it is speculated that the processing under atmospheric (oxygenated) conditions results in the following partially oxidized cross-linked structure:

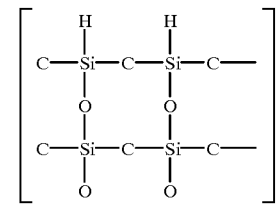

The structure speculated when the instant process is completely carried out under non-oxygenated conditions is as follows:

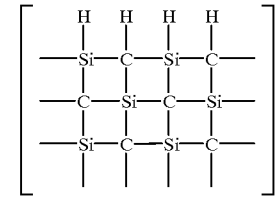

During the process formation of each of these structures, the silicon-hydrogen bonds in the precursor polycarbosilane polymers causes formation of strong adhesive bonding with the coated substrate.

Curing can be carried out at any temperature and time suitable for completion of the crosslinking and hardening of the polycarbosilane in an inert environment to a partially oxidized cross-linked dielectric layer. However the curing temperature should not be below 350° C. because a lower temperature is insufficient to complete the crosslinking of the polycarbosilane polymer. Generally, it is preferred that curing is carried out at temperatures of from 400° C. to about 450° C. Similarly, the curing time can be varied under consideration of the curing temperature and other conditions, and generally, the preferred range of curing time is from about 30 minutes to about 60 minutes.

Curing can be carried out in a conventional curing chamber such as an electric oven, hot plate, and the like. Curing is carried out in a non-oxidizing atmosphere (Nitrogen, Helium or the like) in the curing chamber. The inert atmosphere generally used in the following Examples is a Nitrogen blanket. Other non oxidizing or reducing atmospheres may be used in the practice of the present invention, if they are effective to conduct curing of the polycarbosilane to achieve the low k dielectric film herein.

In illustrative FIG. 1, a polycarbosilane dielectric interlayer 30 is shown coated on semiconductor substrate 10. Note that the instant dielectric layer 30 has a flat planarized surface not reproducing the stepped profile of the patterned metal layer which has two types of patterned steps, i.e., a relatively wide step 20a such as an electrode and a relatively narrow step 20b such as wiring. After formation of the metal wirepattern layer 20, the instant polycarbosilane layer is spin coated over the metal layer 20 using the polycarbosilane of formula (1) above. Thereafter the layer is subjected to the multi-step heating and curing process herein described herein resulting in the flat dielectric interlayer 30 surface demonstrating the global planarization accomplished by the nature of the low k dielectric polycarbosilane film achieve in the practice of present process invention. Naturally, the instant polycarbosilane and process can be used to sequentially coat multiple patterned metal layers.

By the above methods a silicon-containing planarizing coating is produced on the substrate. The coating smoothes the irregular surfaces of various substrates and has excellent adhesion. In addition, this coating can be quite thick (e.g. >0.5 microns). This polycarbosilane interlayer coating may also be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings and/or diamond like carbon coatings. Such multilayer coatings are taught in U.S. Pat. No. 4,973,526, which is incorporated herein by reference. And, of course, the polycarbosilanes prepared in the instant process can be formed as interlined deposition coatings or films between lined conductor elements on an electronic or fabricated semiconductor substrate.

The following non-limiting Examples are provided so that one skilled in the art may more readily understand the invention.

EXAMPLE 1

2 grams of allylhydridopolycarbosilane, $[[Si(CH_2CHCH)HCH_2]_{0.1}[SiH_2CH_2]_{0.9}]_n$, (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated in sequential elevated temperatures of 80C, 150C, and 250C for three minutes for each step under atmosphere (air) conditions. Then the film was cured in a furnace at 400C for 30 minutes under nitrogen environment.

Figure 2:
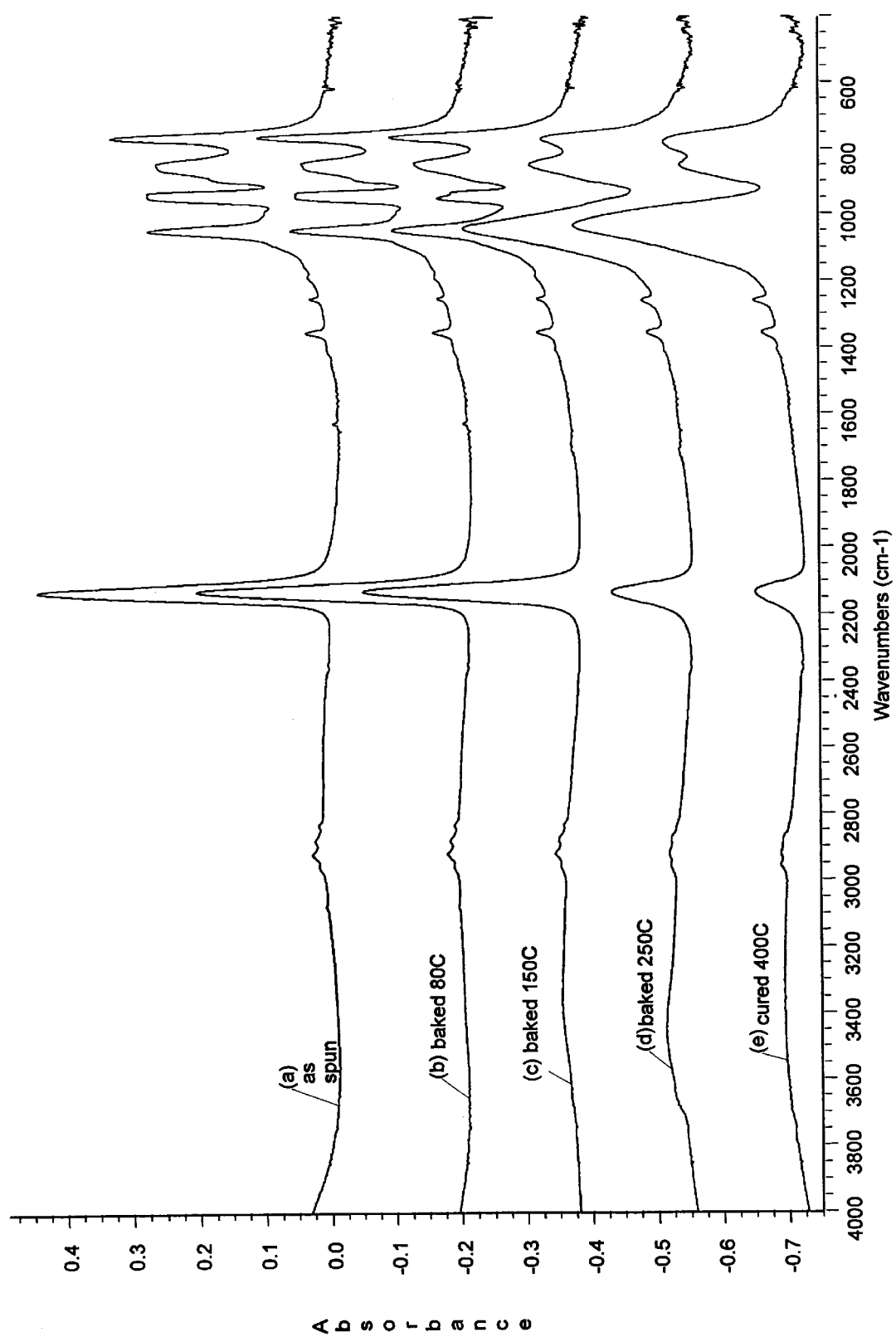
FIG. 2 is the infrared spectra of the polycarbosilane film prepared in Example 1.

FIG. 2 represents the Infrared Spectra of the Films after each process step. (a) as spun; (b) baked at 80° C. (c) baked at 150° C.; (d) baked at 250° C.; and cured at 400° C. IR spectra were obtained on the film as-spun and after each process step. The assignment of the infrared absorption of this material is shown in Table I. The structural change of the spun film during the sequential heating and cure can be monitored by following the infrared spectra of the film after each process step (shown in FIG. 2 Table 2). One obvious change during heating of the film is the decreasing intensity of Si-H absorption at about 2130 $cm^{-1}$. The integration of the Si-H peak area (shown below FIG. 3) indicated the reaction of Si-H during the process. Concurrent with the decrease of Si-H, was an increase in the absorption spectra at about 1050 $cm^{-1}$, indicating formation of Si-O bonding. The presence of the absorption at 1357, 1048, and 765 $cm^{-1}$ indicated the preservation of Si-C structure in the process. The information obtained from infrared spectra suggests that the film after curing at 400° C. has retained the bonding linkages of Si-C, Si-H, Si-O, and C-H . The refractive index was measured on a Woolam ellipsometer. The film after cure at 400C showed film thickness of 6242 A and refractive index of 1.46 at 633 nm. The dielectric constant was measured by the standard CV curve technique at 1 MHz, using MOS capacitor structure. The dielectric constant of the prepared film was 2.5.

TABLE 1

Infrared Absorption Assignment for AHPCS

| Wave Number ($cm^{-1}$) | Assignment |
| --- | --- |
| 2958 | CH3 asymmetric stretching |
| 2923 | CH2 asymmetric stretching |
| 2883 | CH3 symmetric stretching |
| 2853 | CH2 symmetric stretching |
| 2131 | Si—H stretching |
| 1357 | Si—CH2-Si deformation |
| 1254 | Si—CH3 symmetric deformation |
| 1048 | Si—C—Si wag |
| 936 | Si—H2 scissors mode |
| 846 | SiH2 wag |
| 765 | Si—C—Si asymmetric stretching |

TABLE 2

Peak Area In Infrared Spectra After Each Process Step

| | Si—H peak area (2300–2000 cm − 1) | C—H peak area (3050–2700 cm− 1) |
| --- | --- | --- |
| As-spun | 23.97 | 1.953 |
| 80 | 22.97 | 1.851 |
| 150 | 19.77 | 1.924 |
| 250 | 9.13 | 1.813 |
| 400 | 5.92 | 1.433 |

EXAMPLE 2

2 grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of 4" wafer and then the wafer was spun at 2000 rpm for 30 seconds. The coated wafer was heated at sequentially elevated temperatures of 80C, 150C, and 220C for three minutes each under atmosphere (air) conditions. Then the film was cured in a furnace at 400° C. for 60 minutes under a nitrogen blanket environment.

Figure 3:
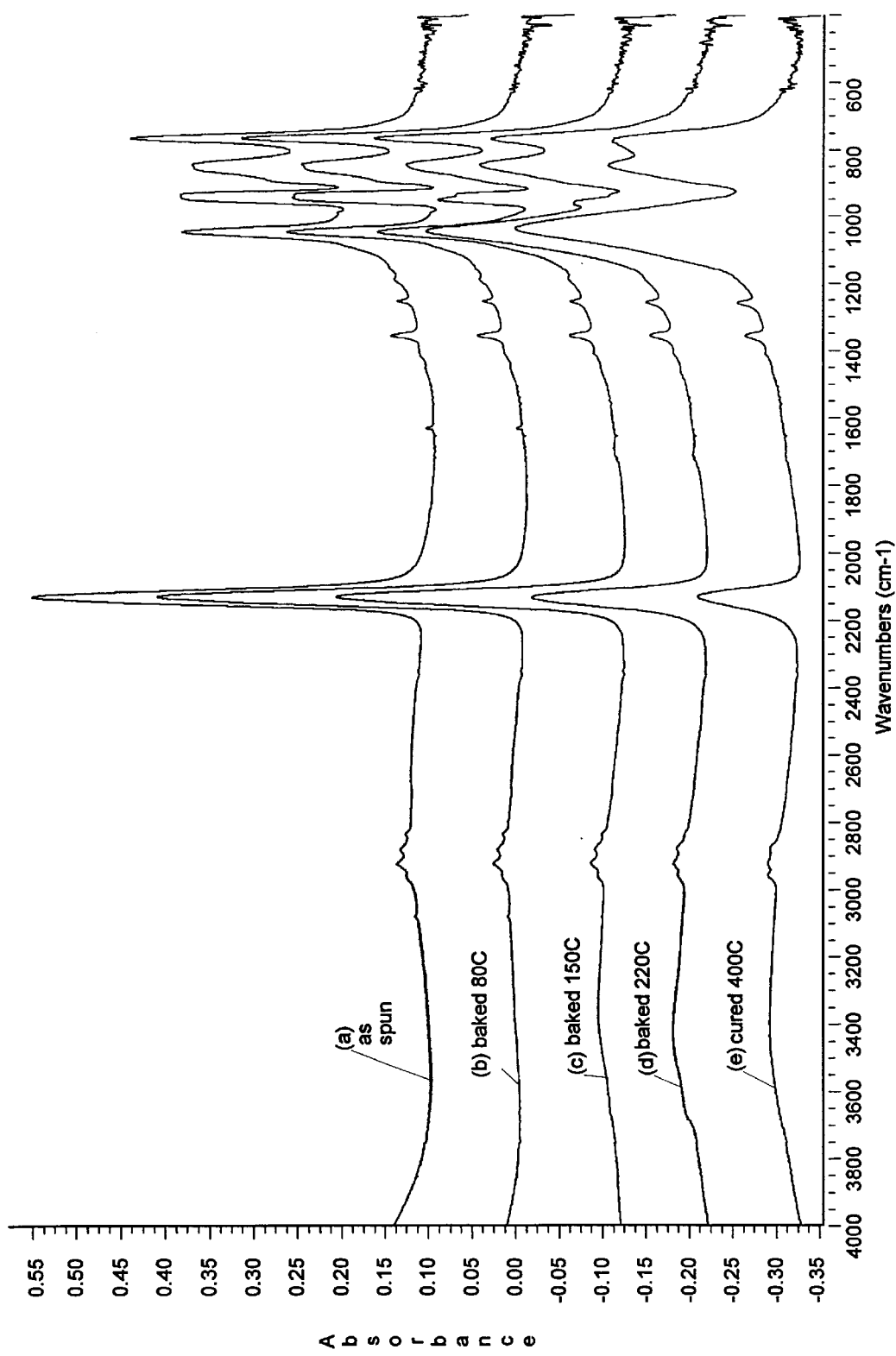
FIG. 3 is the infrared spectra of the polycarbosilane film prepared in Example 2.

FIG. 3 represents the Infrared Spectra of the films after each process step, (a) as spun; (b) baked at 80° C.; (c) baked at 150° C.; (c) baked at 250° C. An (e) cured at 400° C. IR spectra were obtained from the as-spun and after each process step. The assignment of the infrared absorption of this material is shown in Table 1. The structural change of the spun film during the sequential heating and cure can be monitored by following the infrared spectra of the film after each process step as indicated in Table 3 and FIG. 3. One obvious change during heating of the film is the decreasing intensity of Si-H absorption at about 2130 cm$^{-1}$. The integration of the Si-H peak area (shown in FIG. 3) indicated the reaction of the Si-H linkage during the process. Concurrent with the decrease of Si-H linkages, there was an increase in the absorption at about 1050 cm$^{-1}$, indicating formation of Si-O bonding. The presence of the absorption at 1357, 1048, and 765 cm$^{-1}$ demonstrates the preservation and maintenance of the Si-C structure in the backbone of the polymer during the process. The information obtained from infrared spectra suggests that the film after cure at 400C has retained the bonding of Si-C, Si-H, Si-O, and C-H linkages. The refractive index was measured on a Woolam ellipsometer. The film after cure at 400C showed film thickness of 6425 A and refractive index of 1.468 at 633 nm. The dielectric constant was measured by the standard CV curve technique, using MOS capacitor structure. The dielectric constant of the prepared films was 2.6.

TABLE 3

Peak Area In Infrared Spectra After Each Process Step

| | Si—H peak area (2300–2000 cm − 1) | C—H peak area (3050–2700 cm − 1) |
|---|---|---|
| As-spun | 24.02 | 2.08 |
| 80 | 22.96 | 2 |
| 150 | 19.64 | 1.908 |
| 250 | 13.62 | 1.784 |
| 400 | 8.47 | 1.527 |

EXAMPLE 3

2 grams of hydridopolycarbosilane (HPCS), [SiH$_2$CH$_2$]$_n$, purchased from Starfire Systems, Inc. was dissolved in 4 grams of anhydrous dibutyl ether. The solution was then filtred through a 0.2 micron filter. About 2 mL of this solution was dispensed onto the surface of a 4" wafer and then the wafer was spun at 2500 rpm for 30 seconds . As in the earlier Examples, the coated wafer was heated sequentially at 80C, 150C, and 220C for three minutes, each step carried out under atmosphere (air) conditions. Then the film was cured in a furnace at 400C for 60 minutes under a Nitrogen blanket environment.

Figure 4:
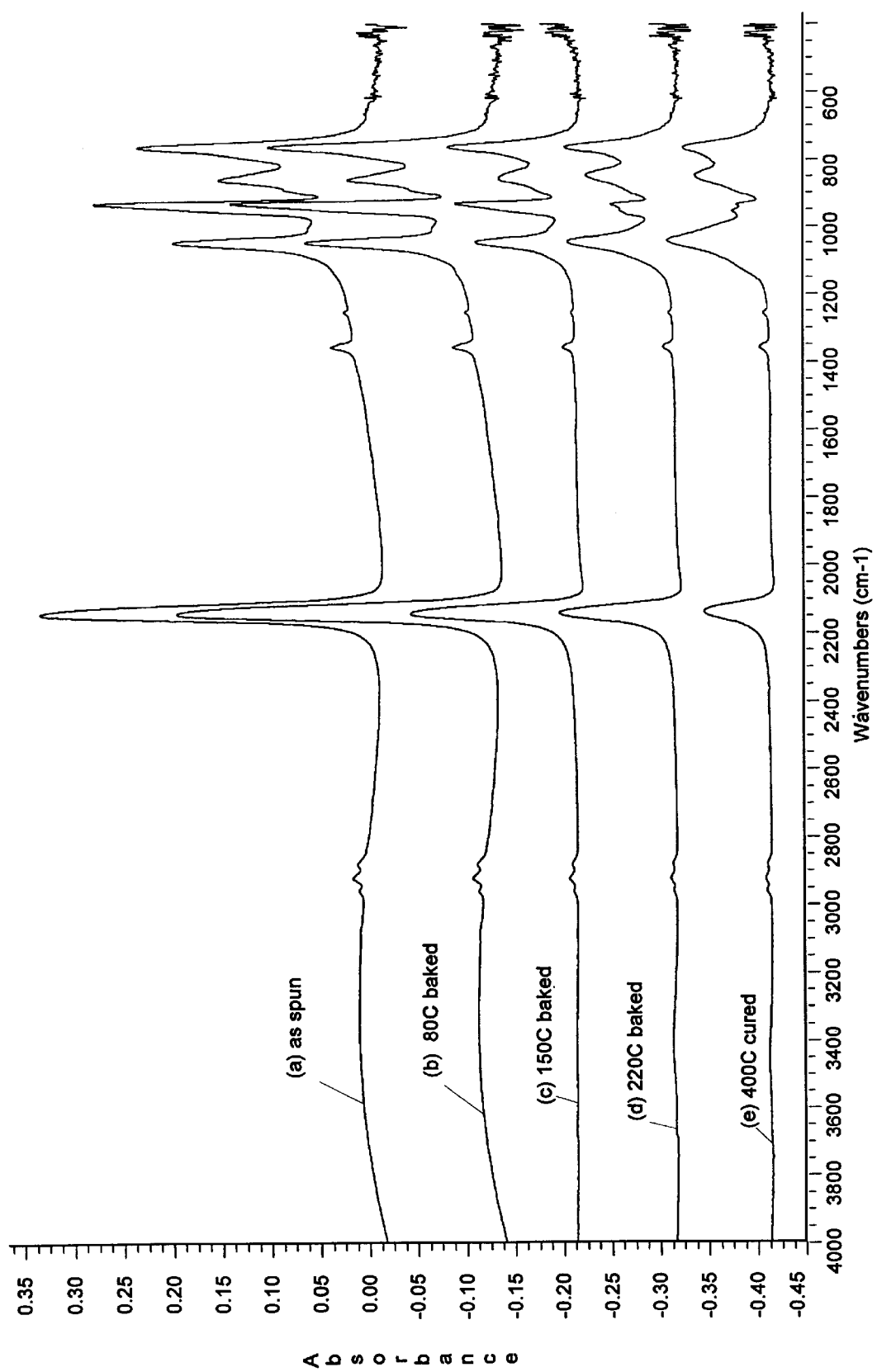
FIG. 4 is the infrared spectra of the polycarbosilane film prepared in Example 3.

FIG. 4 represents the Infrared Spectra of the Films after each pro-step. (a) as spun; (b) baked at 80° C.; (c) baked at 150° C; (d) baked at 250° C.; and (b) cured at 400° C. IR spectra were obtained for the films as-spun and after each process step. The assignment of the infrared absorption of this material is shown in Table 4. The structural change of the spun film during the sequential heating and cure can be monitored by following the FT-IR of the film after each process step. One obvious change during the sequential elevated heating of the film is the decrease intensity of Si-H absorption at about 2143 cm$^{-1}$. As demonstrated below in FIG. 4 and Table 5, the integration of the Si-H peak area indicated the reaction of Si-H during the process. Concurrent with the decrease of Si-H, there was an increase in the absorption at about 1050 cm$^{-1}$, indicating formation of Si-O bonding. The presence of the absorption at 1358, 1048, and 763 cm$^{-1}$ indicated the preservation of Si-C structure in the process. The information obtained from infrared spectra suggests that the film, after curing at 400° C., has the bonding linkages of Si-C, Si-H, Si-O, and C-H. The refractive index was measured on a Woolam ellipsometer. The film after cure at 400° C. demonstrated a film thickness of 3752 A and refractive index of 1.536 at 633 nm.

TABLE 4

Infrared Absorption Assignment for AHPCS

| Wave Number (cm$^{-1}$) | Assignment |
|---|---|
| 2958 | CH3 asymmetric stretching |
| 2923 | CH2 asymmetric stretching |
| 2883 | CH3 asymmetric stretching |
| 2853 | CH2 symmetric stretching |
| 2143 | Si—H stretching |
| 1358 | Si—CH2-Si deformation |
| 1254 | Si—CH3 symmetric deformation |
| 1048 | Si—C—Si wag |
| 932 | Si—H2 scissors mode |
| 861 | SiH2 wag |
| 763 | Si—C—Si asymmetric stretching |

TABLE 5

Peak Area Infrared Spectra After Each Process Step

| | Si—H peak area (2300–2000 cm − 1) | C—H peak area (3050–2700 cm − 1) |
|---|---|---|
| As-spun | 19.81 | 0.968 |
| 80 | 19.09 | 0.931 |
| 150 | 9.81 | 0.503 |
| 220 | 7.21 | 0.397 |
| 400 | 4.62 | 0.387 |

EXAMPLE 4

2 grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated sequentially at 80C, 150C, and 250C for three minutes each under atmospheric (air) conditions. Then the film was cured in a furnace at 400° C. for 30 minutes under a nitrogen blanket environment.

The refractive index was measured on a Woolam ellipsometer. The film after cure at 400C showed film thickness of 5466 A and refractive index of 1.479 at 633 nm. The dielectric constant was measured by the standard CV curve technique, using MOS capacitor structure. The dielectric constant of the prepared films was 2.4. The peak area for cured films: Si-H: 7.09, C-H 1.53.

EXAMPLE 5

2 grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of a 4" wafer and then the wafer was spun at 2000 rpm for 30 seconds. The coated wafer was heated sequentially at 80C, 150C, and 300C for three minutes each under atmospheric (air) conditions. Then the film was cured in a furnace at 400° C. for 30 minutes under nitrogen environment.

The refractive index was measured on a Woolam ellipsometer. The film after cure at 400C showed film thickness of 5549 A and refractive index of 1.469 at 633 nm. The dielectric constant was measured by the standard CV curve technique, using MOS capacitor structure. The dielectric constant of the prepared films was 3.5. The peak area for cured films: Si-H: 2.72, C-H 1.45.

EXAMPLE 6

2 grams of allylhydridopolycarbosilane (AHPCS) purchased from Starfire Systems, Inc. was dissolved in 4 grams of anhydrous dibutyl ether. The solution was then filtered through a 0.2 micron filter. About 2 mL of this solution was dispensed onto the surface of 4" wafer and then the wafer was spun at 2000 rpm for 30 seconds. The coated wafer was heated sequentially at 80C, 150C, and 320C for three minutes each under atmospheric (air) conditions. Then the film was cured in a furnace at 400C for 30 minutes under nitrogen environment.

Figure 5:
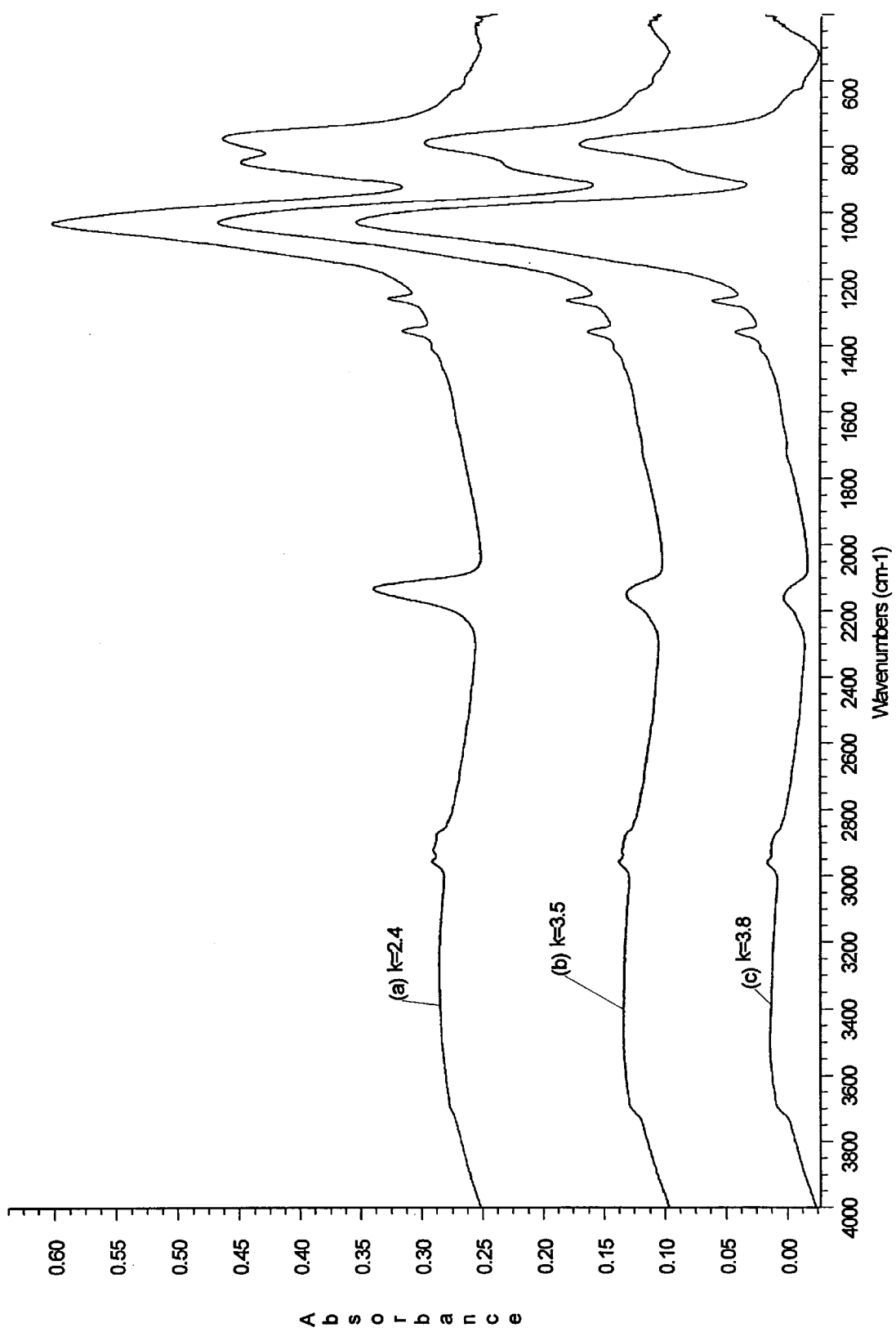
FIG. 5 is the infrared spectra of the polycarbosilane film prepared in Example 6.

FIG. 5 represents the Infrared Spectra of Cured AHPCS films baked at differente temperatures. (a) baked at 250° C.; (b) baked at 300° C.; and (c) baked at 320° C. The refractive index was measured on a Woolam ellipsometer. The film after cure at 400C showed film thickness of 5777 A and refractive index of 1.4576 at 633 nm. The dielectric constant was measured by the standard CV curve technique, using MOS capacitor structure. The dielectric constant of the prepared films was 3.8. The peak area for cured films: Si-H: 1.88, C-H 1.25.

A Comparison of Examples 4, 5, and 6 with the earlier examples demonstrates a direct correlation of the heating process to the ultimate polycarbosilane generated polyorganosilicon product generated in terms of the extent of oxidation (Si-H and Si-C bond retention), and dielectric constant of the resulting films. This correlation can be observed from the following Table 6 and the IR spectra of FIG. 5. As the final bake temperature (in air) is raised, the Si-H peak area decreases and the dielectric constant (k) of the resulting films increased. This dramatically demonstrates that by controlling and changing the heating process temperature or atmospheric conditions, the structure and composition of the processed film can be predictably tuned to produce a film with certain desired properties. The rise of the dielectric constant (k) is directly attributable to the decrease of Si-H and Si-C content and the increase of Si-O in the film. As the Si-O content increases in the film, the film can be expected to behave more like $SiO_2$ film and the dielectric constant k will also be closer to that of $SiO_2$ (k of $SiO_2$ is 3.9).

TABLE 6

The comparison of dielectric constant (k), Si—H peak area, and C—H area

| Final Bake Temperature (C) | k | Si—H peak area | C—H peak area |
|---|---|---|---|
| 250 | 2.4 | 7.09 | 1.53 |
| 300 | 3.5 | 2.72 | 1.45 |
| 320 | 3.8 | 1.88 | 1.25 |

As indicated above, among the instant multi-heating steps at sequentially elevated temperatures, that heating step taking place at temperature of from 200° C. to 300° C. is critical to achievement of low k dielectric film coatings. The preferred range for this treatment step is from about 240° C. to 260° C. to achieve optimal dielectric film coatings having a dielectric constant k of less than 3. An isothermal heat treatment plateau of 250° C. will yield a low k polycarbosilane film of about 2.5.

The Examples all clearly demonstrate that the present multistep heat treatment of polycarbosilanes disclosed herein generates a low k dielectric polyorganosilicon film coating of unexpectedly unique structural character.

While foregoing is directed to the preferred embodiments of the present invention, other and further embodiments of the invention may be devised without departing from the basis scope thereof, and the scope thereof is determined by the claims that follow.

What is claimed is:

1. A process for forming a dielectric material on a semiconductor device comprising
   a) providing a first conductor and a horizontally adjacent second conductor, formed on a substrate wherein a gap is formed between the conductors;
   b) applying to the electronic substrate a polycarbosilane of the general formula

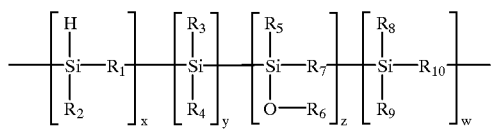

in which:
   $R_1$, $R_7$, and $R_{10}$, each independently represents a substituted or unsubstituted alkylene, cycloalkylene, or arylene group; $R_2$, $R_3$, $R_4$, $R_5$, $R_8$ and $R_9$ each independently represents a hydrogen atom or organic group, $R_6$ represents an organosilicon, a silanyl, a siloxyl, or an organo group; and x, y, z and w satisfying the condition of, and y and z and w can collectively or independently be zero wherein the gaps between said conductors are filled,
   c) heating the polycarbosilane coated substrate in multi-stages at sequentially elevated temperatures of from about 50° C. to about 400° C. to inter-react and cross-link the polycarbosilane to form a polyorganosilicon material layer in the gaps; and
   d). curing the polycarbosilane coated substrate to complete conversion of the polyorganosilicon mate to a low dielectric constant material.

2. The process of claim 1 wherein the polycarbosilane coated substrate is heated in a first stage isothermal plateau of from about 50° C. to about 100° C.

3. The method of claim 2 wherein the polycarbosilane coated substrate is heated in a second stage isothermal plateau of from about 100° C. to about 200° C.

4. The method of claim 3 wherein the polycarbosilane coated substrate is heated in a third stage isothermal plateau of from about 200° C. to about 350° C. prior to curing.

5. The process of claim 1 wherein the applied polycarbosilane is subjected to an e-beam or U.V. or other high energy source in the heating and curing steps.

6. The process of claim 1 wherein the polycarbosilane coated substrate is subjected to isothermal plateaus of from 100° C. to 200° C. in one heating stage and then to isothermal plateau temperatures of from 200° C. to 350° C. prior to a final heating or curing stage at temperatures above 400° C.

7. The process of claim 1 wherein the polycarbosilane is subjected to successive multistage isothermal plateau beating temperatures of less than 100° C., 200° C., and 450° C.

8. The process of claim 1 wherein the entire multistage heating of the polycarbosilane coated substrate is carried out in a non oxidizing environment to prevent oxidation of the heated polycarbosilane.

* * * * *

UNITED STATES PATENT AND TRADEMARK OFFICE
CERTIFICATE OF CORRECTION

PATENT NO.    : 6,225,238 B1
DATED         : May 1, 2001
INVENTOR(S)   : Hui-Jung Wu It is certified that error appears in the above-identified patent and that said Letters Patent is hereby corrected as shown below:

Title page,
Item [73], Assignee, add -- AlliedSignal Inc. --

Signed and Sealed this

Eighteenth Day of January, 2005

JON W. DUDAS
*Director of the United States Patent and Trademark Office*